United States Patent
Lin et al.

(10) Patent No.: US 8,634,206 B2
(45) Date of Patent: Jan. 21, 2014

(54) FIXING DEVICE FOR CIRCUIT BOARD

(75) Inventors: Chieh-Hsiang Lin, Tu-Cheng (TW); Wen-Tang Peng, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 420 days.

(21) Appl. No.: 13/117,140

(22) Filed: May 27, 2011

(65) Prior Publication Data

US 2012/0170229 A1 Jul. 5, 2012

(30) Foreign Application Priority Data

Dec. 29, 2010 (TW) ................................ 99146732 A

(51) Int. Cl.
*H05K 7/02* (2006.01)
*H05K 7/04* (2006.01)

(52) U.S. Cl.
USPC ..................................... 361/807; 174/138 E

(58) Field of Classification Search
USPC ........... 361/807, 809, 810; 174/138 E, 138 G, 174/138 D
See application file for complete search history.

(56) References Cited

U.S. PATENT DOCUMENTS

| | | | |
|---|---|---|---|
| 2,967,556 A * | 1/1961 | Jaworski | 411/112 |
| 5,519,169 A * | 5/1996 | Garrett et al. | 174/371 |
| 6,399,887 B1 * | 6/2002 | Lin | 174/138 D |
| 6,906,266 B2 * | 6/2005 | Verrigni | 174/138 G |
| 7,052,291 B2 * | 5/2006 | Barina et al. | 439/92 |
| 7,192,231 B2 * | 3/2007 | Blackaby | 411/111 |
| 7,387,518 B2 * | 6/2008 | Kozlovski | 439/92 |
| 8,432,703 B2 * | 4/2013 | Lin et al. | 361/759 |
| 2012/0168578 A1 * | 7/2012 | Peng et al. | 248/201 |

* cited by examiner

*Primary Examiner* — Hung S Bui
(74) *Attorney, Agent, or Firm* — Altis Law Group, Inc.

(57) ABSTRACT

A fixing device for circuit boards of different thicknesses includes a base board, a number of posts protruding from the base board, a number of resilient brackets respectively mounted to the posts, a number of blocks respectively received in the resilient brackets and stacked on top of the corresponding posts, and a number of fasteners inserted through the circuit board, and the resilient brackets, and the blocks, to engage in the posts.

7 Claims, 4 Drawing Sheets

FIXING DEVICE FOR CIRCUIT BOARD

CROSS-REFERENCE OF RELATED APPLICATION

Relevant subject matter is disclosed in a pending U.S. patent application, titled "FIXING DEVICE FOR CIRCUIT BOARD", filed on May 25, 2011, with the application Ser. No. 13/115,121, which is assigned to the same assignee as this patent application.

BACKGROUND

1. Technical Field

The present disclosure relates to a device for fixing a circuit board.

2. Description of Related Art

A circuit board ordinarily is fixed to a computer chassis through a plurality of supporting posts. When there is a need to install another circuit board having a different thickness, the supporting posts should be replaced with others. However, in most cases, the supporting posts are an integral part of the chassis, which makes replacement very difficult if not impossible.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
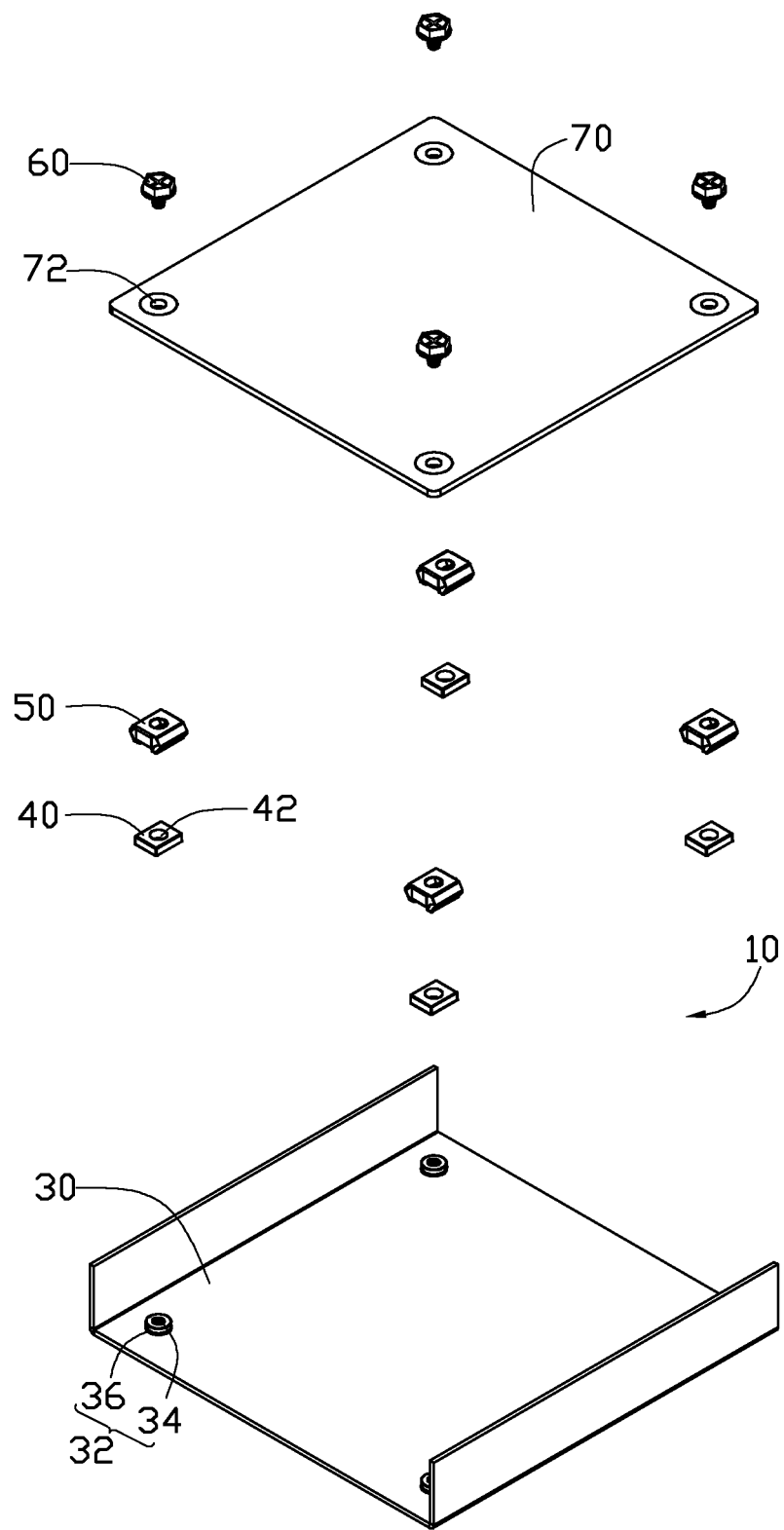
FIG. 1 is an exploded, isometric view of an exemplary embodiment of a fixing device, together with a circuit board; the fixing device includes a plurality of resilient brackets.

Referring to FIG. 1, an exemplary embodiment of a fixing device 10 for fixing different circuit boards includes a base board 30, a plurality of blocks 40, a plurality of resilient brackets 50, and a plurality of fasteners 60. In this embodiment, the fasteners 60 are screws.

In one embodiment, the base board 30 is the sidewall of a computer enclosure, or a board fixed to the sidewall of the computer enclosure. A plurality of posts 32 protrude from the base board 30, each post 32 axially defines a threaded hole 34 in a top, and a circumferential groove (slot 36) in close proximity to the base board 30.

Each block 40 defines a through hole 42.

Figure 2:
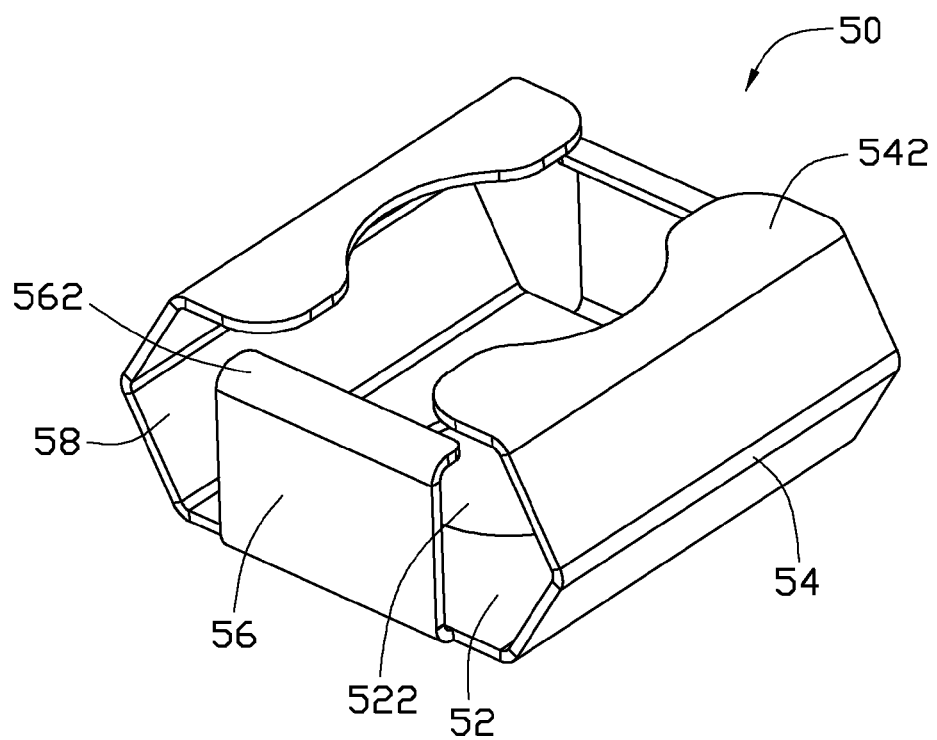
FIG. 2 is an enlarged, inverted view of one of the resilient brackets of FIG. 1.

Referring to FIG. 2, each resilient bracket 50 includes a plate 52, two substantially V-shaped elastic arms 54 extending down from two opposite sides of the plate 52, and two tabs 56 extending down from another two opposite ends of the plate 52. A through hole 522 is defined in the plate 52. A receiving space 58 is bounded by the arms 54 and the tabs 56. Two engaging portions 542 extend from distal ends of the arms 54 toward each other, and substantially parallel to the plate 52. Two holding portions 562 extend from distal ends of the tabs 56 toward each other.

Figure 3:
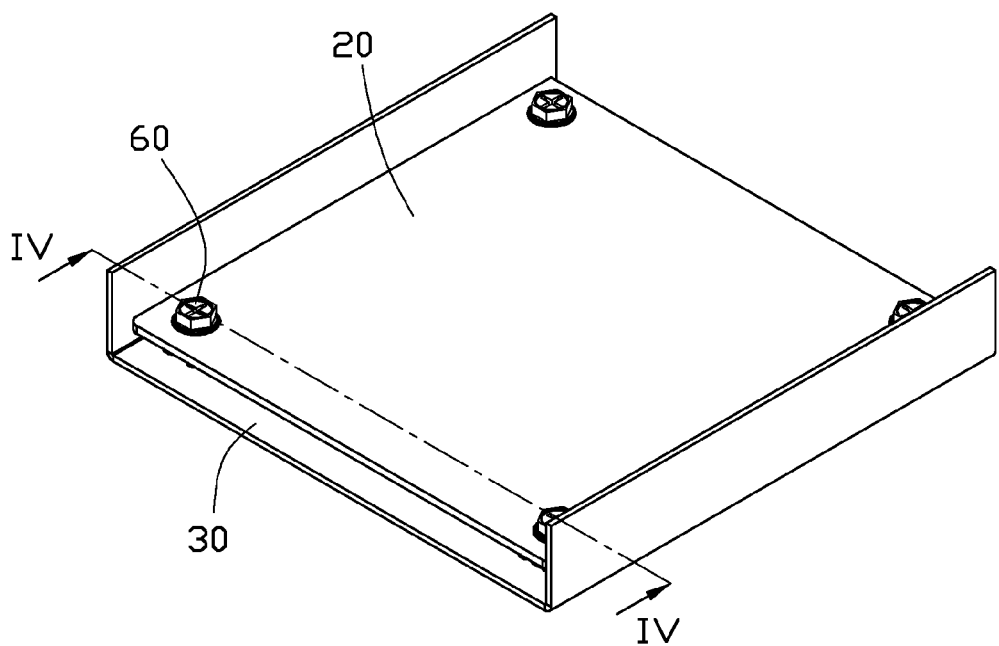
FIG. 3 is an assembled, isometric view of FIG. 1.
Figure 4:
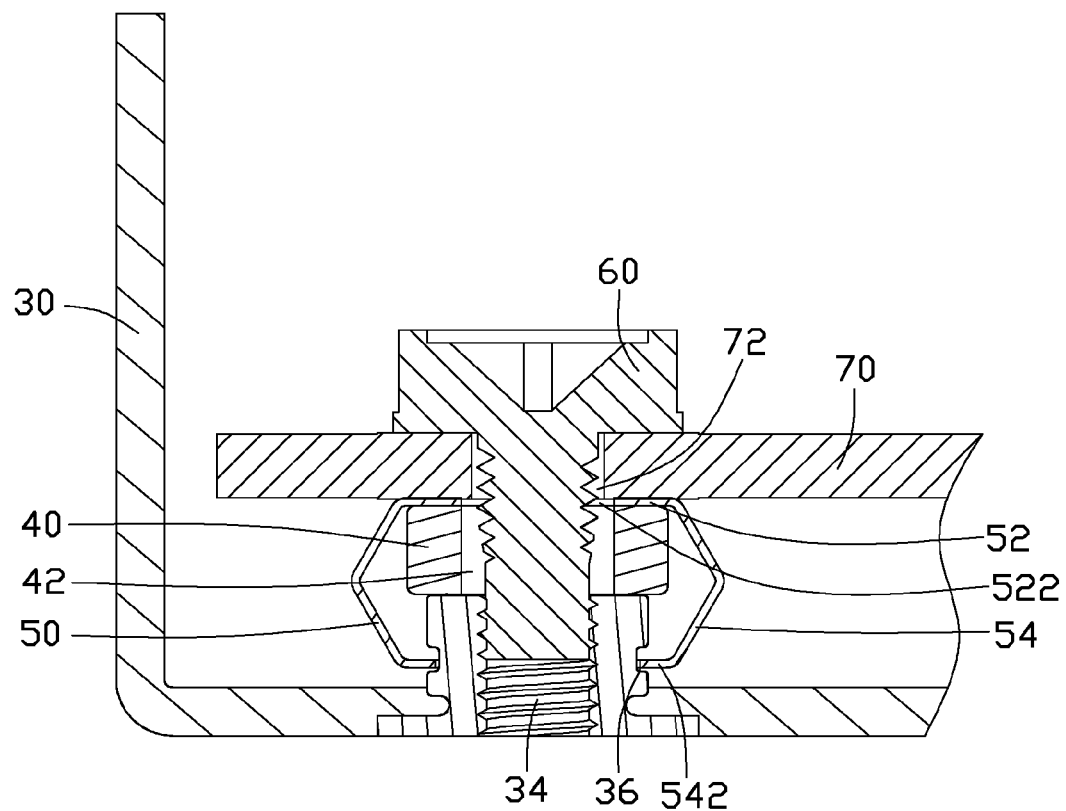
FIG. 4 is a partial, sectional view of FIG. 3, taken along the line IV-IV.

Referring to FIGS. 3 and 4, in assembly, each block 40 is received in the receiving space 58 of a corresponding resilient bracket 50 and supported on the holding portions 562. The through hole 42 of the block 40 is in an alignment with the through hole 522. Each resilient bracket 50 is mounted to a post 32. The post 32 extends into the receiving space 58, until the engaging portions 542 engage in the slot 36. At this time, the block 40 is positioned between the top of the post 32 and the plate 52, with the through hole 42 in alignment with the threaded hole 34.

To fix a circuit board 70 defining a plurality of fixing holes 72, the circuit board 70 is supported on the plates 52, with the fixing holes 72 in alignment with the corresponding through holes 522. The fasteners 60 extend through the fixing holes 72, and the through holes 522 and 42, to engage in the threaded holes 34 of the corresponding posts 32, until the arms 54 are deformed, and the plates 52 contact the tops of the corresponding blocks 40. Thereby, the circuit board 70 is fixed to the base board 30.

In other embodiments, to fix other circuit boards of a greater thickness than the circuit board 70, the resilient brackets 50 are disengaged from the posts 32, and at least one more block 40 is received in the receiving space 58 to suit the thickness of the circuit board.

It is believed that the present embodiments and their advantages will be understood from the foregoing description, and it will be apparent that various changes may be made thereto without departing from the spirit and scope of the description or sacrificing all of their material advantages, the examples hereinbefore described merely being exemplary embodiments.

What is claimed is:

1. A fixing device for circuit boards with different thicknesses, the fixing device comprising:
   a base board;
   a plurality of posts protruding from the base board;
   a plurality of resilient brackets to be respectively mounted to the posts;
   a plurality of blocks respectively received in the resilient brackets and stacked on tops of the corresponding posts; and
   a plurality of fasteners extending through a circuit board, the resilient brackets and the blocks, to engage in corresponding ones of the posts;
   wherein each post defines a slot in a circumference, each resilient bracket comprises a plate to be positioned on a top of the corresponding block and two elastic arms extending down from opposite sides of the plate to engage in the slot of the corresponding post.

2. The fixing device of claim 1, wherein two engaging portions extend from distal ends of the arms, the arms engage in the slot of the post by the engaging portions.

3. The fixing device of claim 1, wherein two tabs extend down from opposite ends of the plate, and bound a receiving space together with the arms to received at least one of the block.

4. The fixing device of claim 3, wherein two holding portions extend from distal ends of the tabs to support the at least one block.

5. The fixing device of claim 1, wherein the arms are substantially V-shaped.

6. The fixing device of claim 1, wherein each block defines a through hole for the corresponding fastener to pass through.

7. The fixing device of claim 1, wherein each post axially defines a threaded hole in a top, the fasteners are screws to screw in the threaded holes of the corresponding posts.

* * * * *